United States Patent
Jang et al.

[11] Patent Number: 5,804,498
[45] Date of Patent: Sep. 8, 1998

[54] METHOD OF MAKING AN UNDERLAYER TO REDUCE PATTERN SENSITIVITY OF OZONE-TEOS

[75] Inventors: Syun-Ming Jang, Hsinchu; Lu-Min Liu, Hsinchu Hsien; Lung Chen, Hsinchu, all of Taiwan

[73] Assignee: Taiwan Semiconductor Manufacturing Company, Ltd., Hsin-Chu, Taiwan

[21] Appl. No.: 907,265

[22] Filed: Aug. 6, 1997

Related U.S. Application Data

[63] Continuation of Ser. No. 494,630, Jun. 23, 1995, abandoned.
[51] Int. Cl.$^6$ .................................................. H01L 21/4763
[52] U.S. Cl. ............................ 438/624; 438/763; 438/789
[58] Field of Search ...................................... 437/195, 235, 437/238, 190, 978; 438/624, 763, 789

[56] References Cited

U.S. PATENT DOCUMENTS

| | | | |
|---|---|---|---|
| 5,344,797 | 9/1994 | Pai et al. | 437/238 |
| 5,376,590 | 12/1994 | Machida et al. | 437/235 |
| 5,518,959 | 5/1996 | Jang et al. | 437/190 |
| 5,518,962 | 5/1996 | Murao | 437/195 |
| 5,536,681 | 7/1996 | Jang et al. | 437/195 |
| 5,563,104 | 10/1996 | Jang et al. | 437/235 |

FOREIGN PATENT DOCUMENTS

| | | | |
|---|---|---|---|
| 6018847 | 3/1985 | Japan | 437/978 |
| 4152308 | 12/1993 | Japan | 437/978 |
| 5335242 | 12/1993 | Japan | 437/978 |

OTHER PUBLICATIONS

Wolf et al., *Silicon Processing For The VLSI Era*, Lattice Press, vol. I, 1986, pp. 183–195; vol. II, 1990, pp. 237–238.
Korczynski et al, "Improved Sub–Micron Inter–Metal Dielectric Gap–Filling Using TEOS/Ozone APCVD", Microelectronics Manufacturing Technology, Jan. 1992, pp. 22–27.

*Primary Examiner*—Charles L. Bowers, Jr.
*Assistant Examiner*—Lynne A. Gurley
*Attorney, Agent, or Firm*—George O. Saile; Stephen B. Ackerman; Rosemary L. S. Pike

[57] ABSTRACT

An improved method of ozone-TEOS deposition with reduced pattern sensitivity and improved gap filling capability is described. Semiconductor device structures are provided in and on a semiconductor substrate. A conducting layer is deposited overlying the surfaces of the semiconductor device structures and patterned to form conducting lines wherein the conducting lines are dense in some portions of the semiconductor substrate and sparse in other portions of the substrate and wherein gaps are formed between the conducting lines. A nucleation layer is formed by depositing a first pattern sensitivity reducing layer over the surfaces of the conducting layer and then depositing a first oxide layer overlying the first dielectric layer. A second oxide layer is deposited over the nucleation layer wherein the gap is filled by the second oxide layer and the fabrication of integrated circuit is completed.

18 Claims, 1 Drawing Sheet

METHOD OF MAKING AN UNDERLAYER TO REDUCE PATTERN SENSITIVITY OF OZONE-TEOS

RELATED PATENT APPLICATIONS

This is a continuation of application Ser. No. 08/494,630, filed Jun. 23,1995 now abandoned.

1) Co-pending U.S. patent application Ser. 08/494,629 (TS94-095) filed on Jun. 23,1995 to S. M. Jang et al.

2) Co-pending U.S. patent application Ser. 08/494,638 (TS94-096) filed on Jun. 23,1995 to S. M. Jang et al.

BACKGROUND OF THE INVENTION (1) Field of the Invention

The present invention relates to the fabrication of integrated circuit devices, and more particularly, to a method of reducing the pattern sensitivity and improving the gap filling characteristics of an ozone-TEOS dielectric layer in the fabrication of integrated circuits.

(2) Description of the Prior Art

In the fabrication of integrated circuits, a conducting layer is deposited over a semiconductor substrate containing semiconductor device structures such as gate electrodes and source and drain regions. The conducting layer is patterned to form conducting lines. A dielectric layer is deposited over the conducting lines and within the gaps between conducting lines. Typically, the dielectric layer is composed of ozone-TEOS (tetraethoxysilane).

Although ozone-TEOS has shown good gap filling capability, it has been observed that the process is pattern dependent. As the metal density increases in an area of an integrated circuit, the deposition rate of ozone-TEOS in that area decreases, leading to nonuniformity problems in the dielectric layer. Referring now to FIG. 1, there is shown a partially completed integrated circuit in which patterned conducting lines 12 have been formed overlying the semiconductor substrate 10. Typically, a first layer of plasma enhanced chemical vapor deposited TEOS (PE-TEOS) 14 is deposited overlying the patterned conducting lines. Next, a layer of ozone-TEOS 16 is deposited over the PE-TEOS layer to fill the gaps between the conducting lines. It has been found that the thickness of the ozone-TEOS layer over dense metal pattern 33 is smaller than the thickness of the layer over a less dense area 35.

Related Patent Application Ser. 08/494,629 (TS94-095) Now U.S. Pat. No. 5,563,104 reduces pattern sensitivity by using a two-step low and high temperature deposition of ozone-TEOS. Related patent application Ser. No. 08/494,638 (TS94-096) now U.S. Pat. No. 5,536,681 improves the gap filling capability of ozone-TEOS by selectively treating the underlayer with N2 plasma.

SUMMARY OF THE INVENTION

Accordingly, it is a primary object of the invention to provide a process for reducing the pattern sensitivity in ozone-TEOS deposition and in the fabrication of integrated circuits.

It is a further object of the invention to provide a process for reducing the pattern sensitivity in ozone-TEOS deposition and also improving gap filling capability.

In accordance with the objects of the invention, an improved method of ozone-TEOS deposition with reduced pattern sensitivity and improved gap filling capability is achieved. Semiconductor device structures are provided in and on a semiconductor substrate. A conducting layer is deposited overlying the surfaces of the semiconductor device structures and patterned to form conducting lines wherein the conducting lines are dense in some portions of the semiconductor substrate and sparse in other portions of the substrate and wherein gaps are formed between the conducting lines. A nucleation layer is formed by depositing a first pattern sensitivity reducing layer over the surfaces of the conducting layer and then depositing a first oxide layer overlying the first dielectric layer. A second oxide layer is deposited over the nucleation layer wherein the gap is filled by the second oxide layer and the fabrication of integrated circuit is completed.

BRIEF DESCRIPTION OF THE DRAWINGS

In the accompanying drawings forming a material part of this description, there is shown.

DESCRIPTION OF THE PREFERRED EMBODIMENTS

Figure 2:
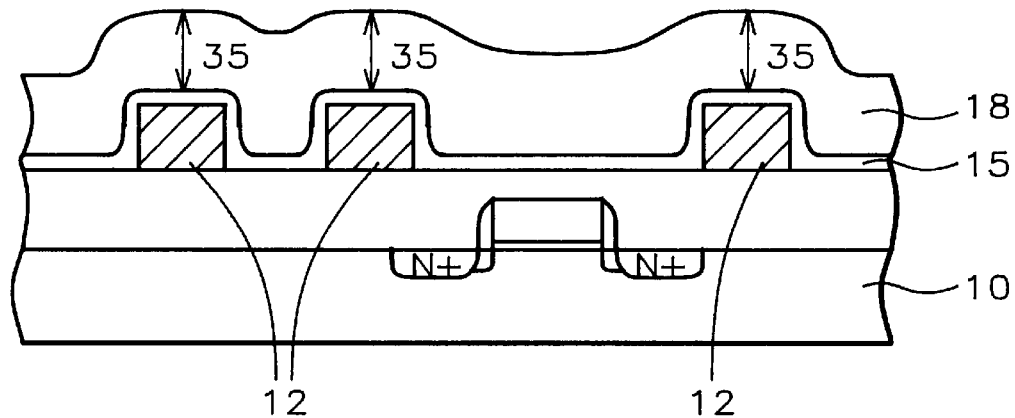
FIG. 2 is a cross-sectional representation of one preferred embodiment of the present invention.

Referring now more particularly to FIG. 2, the first preferred embodiment of the present invention will be described. There is shown a semiconductor substrate 10, in which may be formed semiconductor device structures which may include polysilicon gate electrodes and source and drain regions. A layer of conducting material 12 has been deposited over the planarized surface of the semiconductor substrate and patterned. The conducting material may be metal, such as Ti/TiN/AlCu(Si)/TiN or Ti/TiN/Ti/AlCu (Si)/TiN, or the like.

Figure 1:
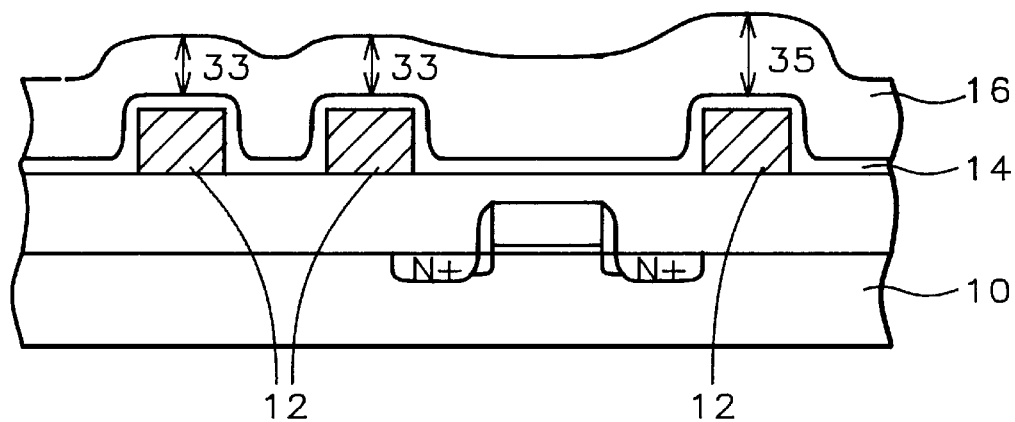
FIG. 1 is a cross-sectional representation of a process of the prior art.

Our recent study shows that the pattern sensitivity in ozone-TEOS ($O_3$-TEOS) deposition, shown in FIG. 1 and described above, is very likely caused by the interaction of $O_3$-TEOS precursors and metals; in particular, TiN. It has been observed that $O_3$-TEOS has a lower deposition rate on TiN, suggesting that the reaction precursors are repelled by the TiN. Even with an underlayer of PE-TEOS on the metal, it has been observed that $O_3$-TEOS grows more slowly on TiN, indicating that the interaction between the metal and the $O_3$-TEOS precursors is not totally shielded by the PE-TEOS. Some underlayers, perhaps the better quality films such as PE-OX and PE-SiN, may better shield the interaction and lead to less pattern sensitivity.

In order to inhibit pattern sensitivity, an underlayer which helps reduce the interaction of the $O_3$-TEOS reaction precursors and the conducting lines will be deposited in place of the PE-TEOS layer which is less effective in reducing the interaction. Nitride is a well known, dense, good quality film. Therefore, PE-SiN is a good choice for the underlayer. Another possibility is a plasma enhanced silicon oxide or hydride, such as PE-SiH$_4$.

The nucleation layer 15 of PE-SiN or PE-SiH$_4$ is deposited over the surface of the patterned conducting layer at a temperature of between about 380° to 420° C. to a thickness of between about 500 to 1000 Angstroms. This good quality film is effective in shielding the underlying metal lines. Furthermore, such a dielectric layer may serve to prevent moisture attack of the conducting lines from the ozone-TEOS layer. PE-SiN and PE-SiH$_4$ are both more effective moisture barriers than is PE-TEOS.

For better quality films like PE-SiN and PE-SiH$_4$, the bondings are more complete; i.e. less porous, thus they may be more effective in shielding the interaction between the O$_3$-TEOS precursors and the metal. Or the bondings in PE-SiN and PE-SiH$_4$ may favor O$_3$-TEOS deposition more than PE-TEOS does.

Finally, an ozone-TEOS layer 18 is deposited by subatmospheric chemical vapor deposition overlying the nucleation layer at the same temperature of between about 380° to 420 ° C. to a thickness of between about 4000 to 6000 Angstroms. It has been found that the thickness 35 of the ozone-TEOS layer over dense metal pattern is now the same as the thickness 35 of the layer over a less dense area.

The second preferred embodiment will now be described with reference to FIG. 3. Ozone-TEOS with an underlayer of PE-TEOS has well-known good gap filling capability. However, as shown above, it suffers from serious pattern sensitivity. The pattern sensitivity can be reduced by replacing the PE-TEOS with PE-SiN or PE-SiH$_4$, as described in the first embodiment. However, the gap filling capability of ozone-TEOS with such an underlayer becomes poor. This embodiment both reduces pattern sensitivity and improves gap filling by using an underlayer composed of both PE-SiN or PE-SiH$_4$ and PE-TEOS.

Figure 3:
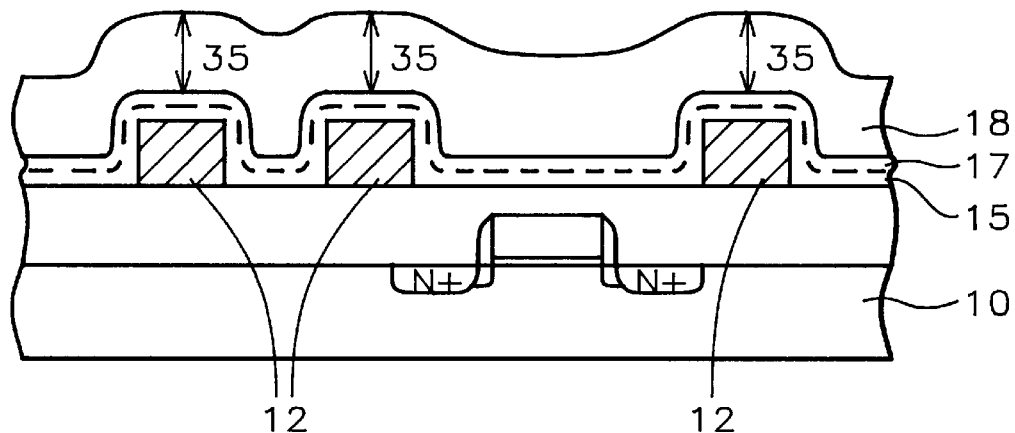
FIG. 3 is a cross-sectional representation of a second preferred embodiment of the present invention.

Referring now to FIG. 3, the same conducting lines 12 have been formed over the surface of the semiconductor substrate 10. A first layer of high quality material 15 such as PE-SiN or PE-SiH$_4$ is deposited over the patterned conducting lines. The material is deposited at a temperature of between about 380° to 420° C. to a thickness of between about 500 to 1000 Angstroms. PE-SiH$_4$ is preferred because it has better step coverage than does PE-SiN.

Next, a layer of PE-TEOS 17 is deposited over the layer 15 at the same temperature of between about 380° to 420° C. to a thickness of between about 500 to 1000 Angstroms. This completes the underlayer. From our experiments, it was seen that the thicker the underlayer, the less the pattern sensitivity. This is consistent with the idea that there is interaction between the precursors and the metal. For a thicker underlayer, the repulsive force is reduced, so the thickness is less metal density dependent. Normally, the underlayer thickness is between about 1000 to 2000 Angstroms for O$_3$-TEOS gap filling. If the underlayer is too thick, the O$_3$-TEOS gap filling becomes difficult. If it is too thin, the protection to the device is lessened. The high quality component of the underlayer 15 reduces pattern sensitivity and the PE-TEOS portion 17 provides a better profile for gap filling of the ozone-TEOS.

Finally, ozone-TEOS layer 18 is deposited by subatmospheric chemical vapor deposition overlying the nucleation layer at the same temperature of between about 380° to 420° C. to a thickness of between about 4000 to 6000 Angstroms. It has been found that the thickness of the ozone-TEOS layer over dense metal pattern 35 is the same as the thickness of the layer over a less dense area.

The process of the present invention provides a method to reduce pattern sensitivity of ozone-TEOS deposition and a method both to reduce pattern sensitivity and to improve gap filling capability of ozone-TEOS.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit comprising:

providing semiconductor device structures in and on a semiconductor substrate;

depositing a conducting layer overlying the surfaces of said semiconductor device structures and patterning said conducting layer to form conducting lines wherein said conducting lines are dense in some portions of said semiconductor substrate and sparse in other portions of said semiconductor substrate wherein gaps are formed between said conducting lines;

depositing a pattern sensitivity reducing layer comprising one of the group consisting of plasma enhanced silicon nitride and plasma enhanced SiH$_4$ over the surfaces of said conducting layer;

depositing a first oxide layer over said pattern sensitivity reducing layer wherein said gaps between said conducting lines remain;

depositing a second oxide layer over said first oxide layer wherein said gaps are filled by said second oxide layer and wherein the thickness of said second oxide layer is uniform over both said portions of dense conducting lines and portions of sparse conducting lines; and completing the fabrication of said integrated circuit.

2. A method according to claim 1 wherein said first oxide layer comprises plasma enhanced TEOS oxide and wherein the thickness of said first oxide layer is between about 500 to 1000 Angstroms.

3. A method according to claim 1 wherein the thickness of said pattern sensitivity reducing layer is between about 500 to 1000 Angstroms.

4. A method according to claim 1 wherein said second oxide layer comprises ozone-TEOS deposited by subatmospheric chemical vapor deposition to a thickness of between about 4000 to 6000 Angstroms.

5. A method according to claim 1 wherein said deposition temperature is between about 380° and 420° C.

6. A method of manufacturing an integrated circuit comprising:

providing semiconductor device structures in and on a semiconductor substrate;

depositing a conducting layer overlying the surfaces of said semiconductor device structures and patterning said conducting layer to form conducting lines wherein said conducting lines are dense in some portions of said semiconductor substrate and sparse in other portions of said semiconductor substrate and wherein gaps are formed between said conducting lines;

forming a nucleation layer comprising:
  depositing a pattern sensitivity reducing layer comprising plasma enhanced SiH$_4$ at a deposition temperature over the surfaces of said conducting lines; and
  depositing a first oxide layer at same said deposition temperature overlying said pattern sensitivity reducing layer wherein said gaps between said conducting lines remain;

depositing a second oxide layer at same said deposition temperature over said nucleation layer wherein said gaps are filled by said second oxide layer; and completing the fabrication of said integrated circuit.

7. A method according to claim 6 wherein the thickness of said pattern sensitivity reducing layer is between about 500 to 1000 Angstroms.

8. A method according to claim 6 wherein said first oxide layer comprises plasma enhanced TEOS oxide.

9. A method according to claim 6 wherein the thickness of said first oxide layer is between about 500 to 1000 Angstroms.

10. A method according to claim 6 wherein said second oxide layer comprises ozone-TEOS.

11. A method according to claim 6 wherein said second oxide layer is deposited by subatmospheric chemical vapor deposition to a thickness of between about 4000 to 6000 Angstroms.

12. A method according to claim 6 wherein the thickness of said second oxide layer is uniform over both said portions of dense conducting lines and portions of sparse conducting lines.

13. A method according to claim 6 wherein said deposition temperature is between about 380° and 420° C.

14. A method of manufacturing an integrated circuit comprising:

providing semiconductor device structures in and on a semiconductor substrate;

depositing a conducting layer overlying the surfaces of said semiconductor device structures and patterning said conducting layer to form conducting lines wherein said conducting lines are dense in some portions of said semiconductor substrate and sparse in other portions of said semiconductor substrate and wherein gaps are formed between said conducting lines;

forming a nucleation layer comprising:

depositing a pattern sensitivity reducing layer comprising one of the group consisting of plasma enhanced silicon nitride and plasma enhanced $SiH_4$ at a deposition temperature of between 380° and 420° C. over the surfaces of said conducting layer; and depositing a plasma enhanced chemical vapor deposited tetraethoxysilane (PE-TEOS) layer at same said deposition temperature overlying said pattern sensitivity reducing layer wherein said gaps between said conducting lines remain;

depositing an ozone-TEOS layer at same said deposition temperature over said nucleation layer wherein said gaps are filled by said ozone-TEOS layer; and completing the fabrication of said integrated circuit.

15. A method according to claim 14 wherein the thickness of said pattern sensitivity reducing layer is between about 500 to 1000 Angstroms.

16. A method according to claim 14 wherein the thickness of said PE-TEOS layer is between about 500 to 1000 Angstroms.

17. A method according to claim 14 wherein said ozone-TEOS layer is deposited by subatmospheric chemical vapor deposition to a thickness of between about 4000 to 6000 Angstroms.

18. A method according to claim 14 wherein the thickness of said ozone-TEOS layer is uniform over both said portions of dense conducting lines and portions of sparse conducting lines.

* * * * *